(12) United States Patent
Hanson (10) Patent No.: US 7,872,501 B2
(45) Date of Patent: Jan. 18, 2011

(54) DEVICE FOR TRANSFORMING INPUT IN OUTPUT SIGNALS WITH DIFFERENT VOLTAGE RANGES

(75) Inventor: Harold Garth Hanson, Queen Creek, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/531,438

(22) PCT Filed: Mar. 19, 2008

(86) PCT No.: PCT/IB2008/051053

§ 371 (c)(1),
(2), (4) Date: Sep. 15, 2009

(87) PCT Pub. No.: WO2008/114227

PCT Pub. Date: Sep. 25, 2008

(65) Prior Publication Data

US 2010/0194432 A1 Aug. 5, 2010

Related U.S. Application Data

(60) Provisional application No. 60/895,652, filed on Mar. 19, 2007.

(51) Int. Cl.
*H03K 19/0175* (2006.01)
(52) U.S. Cl. .............................. 326/81; 326/83; 326/68; 327/333
(58) Field of Classification Search ............. 326/62–63, 326/68, 80–83, 86–87; 327/333
See application file for complete search history.

(56) References Cited

U.S. PATENT DOCUMENTS

| 4,978,870 | A | 12/1990 | Chen et al. |
| 5,896,043 | A | 4/1999 | Kumagai |
| 7,443,200 | B2 * | 10/2008 | Quinn et al. .................. 326/68 |
| 2003/0042536 | A1 | 3/2003 | Pulkin et al. |
| 2006/0069937 | A1 | 3/2006 | Peng |
| 2008/0100341 | A1 * | 5/2008 | Kim ............................ 326/63 |
| 2008/0100342 | A1 * | 5/2008 | Muhlbacher et al. .......... 326/81 |
| 2008/0204109 | A1 * | 8/2008 | Pilling et al. ................ 327/333 |

* cited by examiner

*Primary Examiner*—Rexford N Barnie
*Assistant Examiner*—Jany Tran (57) ABSTRACT

Arrangement for accepting an input signal in a first voltage range and producing an output signal in a second voltage range. A transition detection circuit (230) detects a transition from a high level to a low level of the input signal and a control circuit (245) operates a first FET to produce the low level of the output signal. A second FET is operated by the high level of the input signal to output the high level of the output signal.

16 Claims, 6 Drawing Sheets

DEVICE FOR TRANSFORMING INPUT IN OUTPUT SIGNALS WITH DIFFERENT VOLTAGE RANGES

The present invention relates generally to input circuitry that is responsive to different input voltages and more specifically to input circuitry that operates efficiently with a range of input voltages.

Many semiconductor devices are designed to transmit and receive digital signals between themselves and other devices. Often the digital signals are defined using a protocol that defines high and low digital states using respective high and low voltage levels. These voltage levels are often determined by the supply voltage of the semiconductor device. These voltage levels are often defined in terms of an input voltage level and an output voltage level. The input and output levels are designed to ensure that the correct signal is received and thus an error margin is often implemented. For instance, a 5 volt semiconductor device may have an output high voltage signaling level (Voh) of 4.5 volts and an output low signaling level (Vol) of 0.5 volts. The corresponding input voltages might be Vih=4 volts and Vol=1 volt. This model works well for semiconductor devices that operate in the same voltage range; however, the operating voltages of semiconductor devices continue to decrease. For example, the 5V range was once a common standard, yet today semiconductor devices have voltages that range from 3.3V, 2.5V, 1.8V, 1.2V, 0.9V and beyond. This creates problems in systems that provide communications between devices with different supply voltages because many voltage ranges have incompatible high or low voltage definitions (e.g., Voh/Vih and Vol/Vil). Moreover, it is often desirable for a semiconductor device to be compatible with multiple voltage ranges.

Different methods have been implemented to resolve incompatible voltage ranges. One such method requires the addition of voltage translation devices to the system design. This solution increases chip count and power dissipation. Another method requires bringing the transmitting power voltage onto the receiving chip. This solution increases die and package costs because it requires more pins on the package and pads on the silicon; it also leads to power dissipation due to the mismatch between the voltage of the receiving chip and the voltage of the transmitting chip.

These and other issues have presented challenges to the implementation of efficient input circuits that are compatible with different voltage ranges.

Various aspects of the present invention are directed to arrangements and circuits for receiving signals with variable voltage ranges in a manner that addresses and overcomes the above-mentioned issues and other issues as directly and indirectly addressed in the detailed description that follows.

According to an example embodiment of the present invention, an integrated circuit includes a receiving circuit that produces an internal signal from a received signal. The receiving circuit produces the internal signal independent of the steady-state signal level for at least one state of the received signal. This independence is accomplished using alternating current (AC) coupling of the received signal and a transition detection circuit. The receiving circuit drives the internal signal to voltages consistent with the integrated circuit in response to the transition detection circuit and the received signal.

According to another example embodiment of the present invention, an integrated circuit is implemented to produce an internal signal having an upper switching threshold (Voh) and a lower switching threshold (Vol). The internal signal is responsive to an input signal with a lower switching threshold (Vil) and an upper switching threshold (Vih) different from the Voh of the internal signal. The circuit has a detection circuit that uses capacitive coupling of the input signal to isolate the detection circuit from a steady-state value of the input signal and that produces a detection signal that indicates a transition of the input signal from above Vih to below Vih. A first field-effect transistor (FET), responsive to the detection signal, drives the internal signal above Voh and, responsive to the input signal exceeding Vil, releases the internal signal. A second FET drives the internal signal below Vol in response to the input signal being above Vil and releases the internal signal in response to the input signal being below Vil.

According to another example embodiment of the present invention, a circuit arrangement is implemented for receiving an indication of a first state and a second state by providing an output signal in a first signaling range. The output signal is responsive to an input signal operating in a second signaling range. The circuit arrangement has a first switch that, when enabled, drives a node to the first state in the first signaling range. A second switch, when enabled, drives the node to the second state in the first signaling range. A transition detection circuit detects a transition of the input signal, in the second signaling, from the first state to the second state using capacitive coupling of the input signal to isolate the detection circuit from a steady-state value of the input signal. The circuit arrangement also has control circuitry that is arranged to enable the first switch in response to the transition detection circuit detecting the transition, to disable the first switch in response to the input signal being in the first state, to enable the second switch in response to the input signal being in the first state, and to disable the second switch in response to the input signal being in the second state.

According to another example embodiment of the present invention, a circuit arrangement is implemented for receiving an input signal indication of a first state and a second state by providing an output signal in a first signaling range. The output signal is responsive to an input signal operating in a second signaling range. The circuit arrangement has a first switch means for driving the output signal to the first state in the first signaling range. A second switch means drives the output signal to the second state in the first signaling range. A transition detection means detects a transition of the input signal using capacitive coupling of the input signal to isolate the detection circuit from a steady-state value of the input signal. Control circuitry means controls the first switch and the second switch in response to the state of the input signal, a signal from the detection means and the current state of the output signal.

The above summary of the present invention is not intended to describe each embodiment or every implementation of the present invention. Advantages and attainments, and other attributes, will become apparent and appreciated by referring to the following detailed description and claims taken in conjunction with the accompanying drawings.

The invention may be more completely understood in consideration of the following detailed description of various embodiments of the invention in connection with the accompanying drawings, in which:

FIGS. 3A-4B illustrate the signal levels at selected points of the receiving circuitry depicted in FIG. 2 and at various times, according to example embodiments of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of arrangements and approaches for receiving signals used in electrical communications between two devices. While the present invention is not necessarily limited to such applications, an appreciation of various aspects of the invention is best gained through a discussion of examples in such an environment.

According to an example embodiment of the present invention, a sending device produces an input signal for receipt at a receiving device. The receiving device includes receiving circuitry for receiving the input signal and producing a corresponding/internal signal to be used by the receiving device. The receiving circuitry can operate at the supply/signaling voltage level of the receiving device without bringing in or otherwise using the signaling voltage level of the sending device. The receiving device can also operate with low static/steady-state current draw. The receiving device includes drive circuitry for producing the internal signal. The receiving circuitry isolates the static voltage level (e.g., high voltage level) of the input signal from the drive circuitry using, for example, capacitive coupling. An edge detection circuit provides a signal that indicates when a negative transition of the input signal occurs. Another circuit provides a signal that indicates whether the input signal is above or below a low voltage threshold (Vil). The edge detection circuit and the Vil comparison circuit provide signals that control the drive circuitry without reference to the static voltage level of the input signal for at least one of the states.

According to a more specific embodiment of the present invention, the receiving device uses capacitive coupling linked with a resistive pull-up to implement the edge detection circuit. Two field-effect-transistors (FETs) are used to drive the internal signal to the appropriate levels (e.g., high and low signal values for the receiving device). More specifically, a first FET drives the internal signal to a low voltage level that is below the low voltage threshold of the receiving device (Vol), such as to ground. A second FET drives the internal signal to a high voltage level that is above a high voltage threshold of the receiving device (Voh), such as a supply voltage. Control circuitry receives the input signal and a signal from the edge detection circuit and uses these signals to enable the FETs appropriately. The use of FETs to drive the internal signal is useful for limiting the static current of the receiving circuitry because, during steady-state, the current draw of the receiving circuitry can be negligible (e.g., limited primarily to compensation for current leakage and any loading provided by the receiving device). This can be seen as a reduction of current when compared to circuits that rely upon other driving mechanisms, such as pull up resistors and the like. Moreover, the receiving circuit may also be useful for maintaining efficient current consumption while the input signal is between the Vih and Vil levels. For example, the receiving circuit has a small current draw when the internal signal is at steady-state. This steady-state current draw is not adversely affected by the input signal being between Vih and Vil because the receiving circuit will maintain/reach a steady-state for such a case. This can also potentially reduce oscillation of the internal signal due to such input signals. This can be particularly useful for cases where the input signal can go undefined or float between Vih and Vil for a period of time. Static-voltage isolation provided by the edge detection circuit between the control circuitry and the input signal's high voltage level is also particularly useful for a receiving circuit that operates independent of a difference in signaling levels between the sending circuit and the receiving circuit. For example, current draw of the receiving device can be substantially independent of the voltage differential between the sending and receiving devices.

Figure 1:
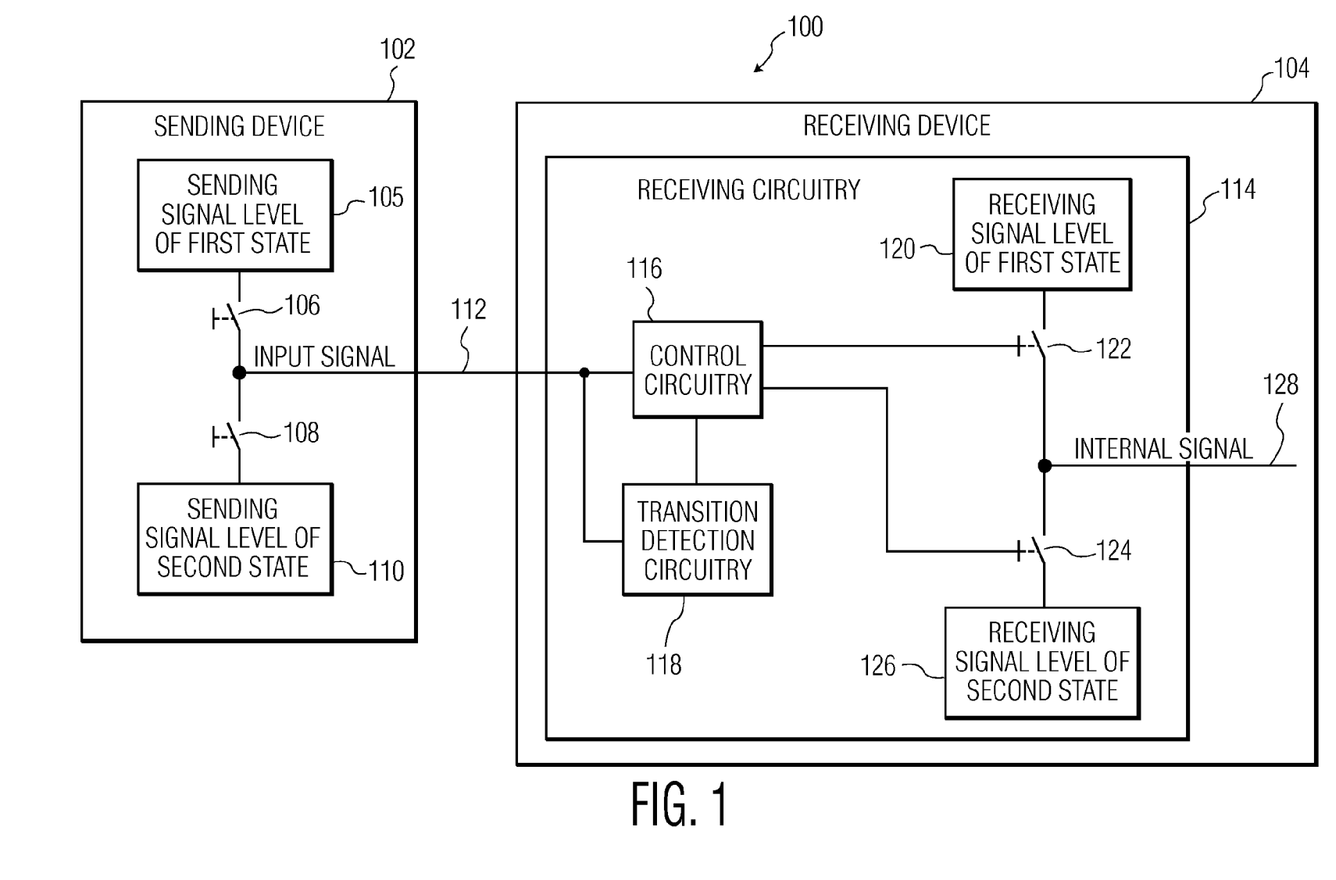
FIG. 1 illustrates a block diagram for an arrangement that receives an input signal and produces a corresponding internal signal, according to an example embodiment of the present invention.

Turning now to the figures, FIG. 1 illustrates a block diagram 100 for an arrangement that receives an input signal and produces a corresponding internal signal, according to an example embodiment of the present invention. FIG. 1 depicts a sending device 102 that produces an input signal 112 for receipt by a receiving device 104 through receiving circuitry 114. The receiving circuitry 114 then produces an internal signal 128. The sending device 102 produces the input signal 112 by driving the signal between a first state and a second state. As used herein and unless otherwise stated, the first and second states correspond to signaling/voltage levels of a signal. The sending device 102 uses a "sending signal level for the first state" 105 and a "sending signal level for the second state" 110. The sending device 102 uses drive circuitry 106, 108 to drive the input signal 112. The drive circuitry 106, 108 is shown as two switches connecting the input signal 112 to respective signaling levels; however, one skilled in the art would recognize that the sending device 102 could use any number of different signal generation circuits and techniques including, but not limited to, transistor-transistor logic (TTL), resistor-transistor logic (RTL) and diode transistor logic (DTL). Moreover, the input signal 112 could be used as a unidirectional signal, a bidirectional signal, a point-to-point signal or a bussed signal.

The receiving device 104 operates at a receiving signaling level that is shown by "receiving signal level for the first state" 120 and "receiving signal level for the second state" 126. Transition detection circuitry 118 isolates control circuitry 116 from the static level of the "sending signal level of the first state" 105. The transition detection circuitry 118 also provides a signal that indicates when input signal 112 transitions between the first signaling level 105 and the second signaling level 110. The control circuitry 116 controls the state of the internal signal 128 using switches 122, 124 to drive the internal signal between receiving signal level 120 and receiving signal level 126. The isolation from the static level of the "sending signal level of the first state" 105 is particularly useful for implementing the receiving circuitry 114 simply and efficiently. More specifically, the receiving circuitry 114 can be implemented without an independent voltage source (e.g., input pin or local supply) that corresponds to the "sending signal level of the first state" 105.

In a specific embodiment of the present invention, the first state is represented by a high voltage (e.g., supply voltage) and the second state is represented by a low voltage (e.g., ground). The sending device 102 and the receiving device 104 use the low voltage as a common reference. The control circuitry 116 detects whether the input signal 112 is above or below the low voltage to determine when the input signal is in the second state. This provides a sufficiently fast response to a transition from the second state to the first state because the detection happens at a voltage level that is at an early phase of the transition. When transitioning from the high to low voltage there need not be high reference voltage that is common to both the sending device 102 and the receiving device 104. Such a common reference voltage would often be used to indicate a transition from high to low. Instead, the transition detection circuitry 118 provides such an indication. This is particularly useful for providing a fast response to transitions from high to low without requiring the use of a high reference voltage that is the same between both the sending device 102 and the receiving device 104. One skilled in the art would recognize that the common reference point could be implemented at either of the high or low signaling levels. For simplicity, the discussion herein refers to a circuit having a common low signaling level; however, one skilled in the art would recognize that a common high signaling level could generally be implemented instead.

According to another embodiment of the present invention, the receiving circuitry 114 could be implemented with transition detection circuitry for detecting both high to low and low to high transitions. This could be particularly useful for isolating the receiving device from both high and low signaling levels of the sending device. This can also be useful for a sending device that does not use ground for either of the signaling levels. For example, a receiving device operating between 0 volts and 1.8 volts could still receive a signal from a sending device that provides a signal having high and low signaling levels of 5 volts and 3.3 volts, respectively.

Figure 2:
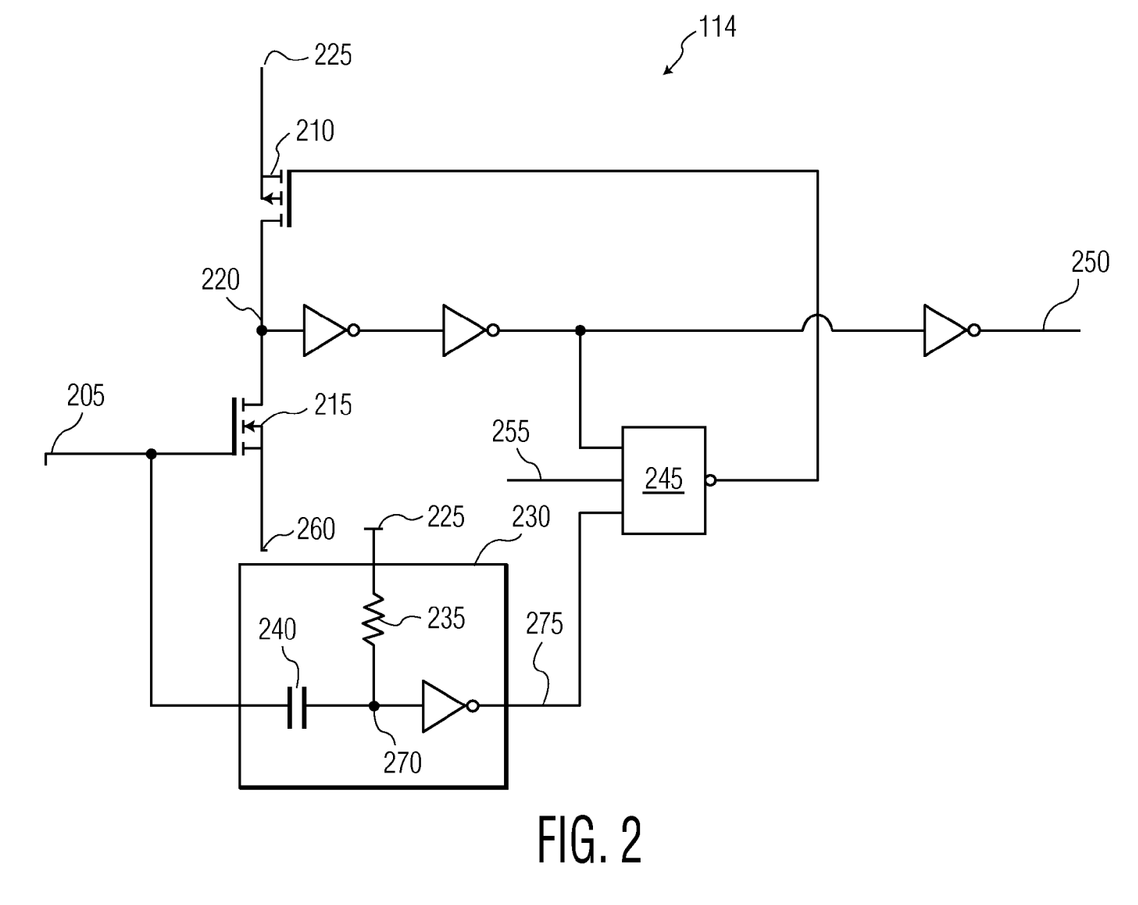
FIG. 2 illustrates a more specific embodiment of the receiving circuitry 114 of FIG. 1, according to an example embodiment of the present invention.

FIG. 2 illustrates a more specific embodiment of the receiving circuitry 114, according to an example embodiment of the present invention. The receiving circuitry 114 receives an input signal 205 and generates a corresponding internal signal 250. Transition detection circuitry 230 is capacitively coupled to the input signal 205 through a capacitor 240. The capacitor 240 provides isolation from the steady-state signaling levels of the input signal 205. More specifically, sufficiently fast changes in the input signal 205 are seen across the capacitor 240, while the steady-state voltages of the input signal 205 are not. The resulting signal is provided to a NOR gate 245 through an inverter and then used to control FET 210.

One skilled in the art would recognize that the values of the capacitor 240 and of a resistor 235 determine the speeds and voltages at which the circuit operates. More specifically, the RC time constant in the transition detection circuitry 230 must be slow enough to allow an input signal with its high to low slew rate to produce a "0" at the input to the inverter, yet high enough that it recovers before the next transition.

The input signal 205 is also provided directly to FET 215. FET 215 is enabled in response to the input signal 205 exceeding the voltage threshold (Vt) of the FET. When enabled FET 215 drives node 220 to ground 260. FET 210 is enabled in response to the input signal 205 transitioning from high to low via the transition detection circuitry 230 and NOR gate 245. When enabled FET 210 drives node 220 to an internal signaling level or power level 225. Accordingly, node 220 represents an inverted state of the input signal 205 that is consistent with the signaling level of the receiving device.

In a particular instance, FET 215 is an NMOS device, FET 210 is a PMOS device and the states of the input signal are digital signals representing "1" or "0." When the input signal 205 transitions from high to low, the transition detection circuitry 230 detects the transition and produces a corresponding signal. This signal is provided to the input of the inverter in the transition detection circuitry 230, which detects a "0." The inverter then produces a "1" on the input of NOR gate 245. The NOR gate 245 then produces a "0" on the input of the PMOS device 210, which turns it on, pulling its drain to a "1." The two inverters place this "1" at the input of NOR gate 245, keeping the PMOS device 210 on. The transition detection circuitry 230 then resumes its steady state, which is a "1" and the output of its inverter is a "0." When the input signal 205 transitions from low to high the input voltage becomes higher than the NMOS device 215 Vt, and the drain of the NMOS device becomes a "0." This produces a "0" on the input of NOR gate 245 and thus a "1" on the gate of the PMOS device 210, which turns it off, effectively removing all current through the PMOS device.

In a particular embodiment of the present invention, a reset signal 255 can be optionally implemented. The reset signal 255 functions to place the receiving circuitry 114 in a known state. This is particularly useful for initiating the device during power up and recovering from unknown signaling conditions. For example, the receiving circuitry 114 may begin in an incorrect state and provide erroneous data until such a time as the first voltage transition is detected.

Figure 3A:
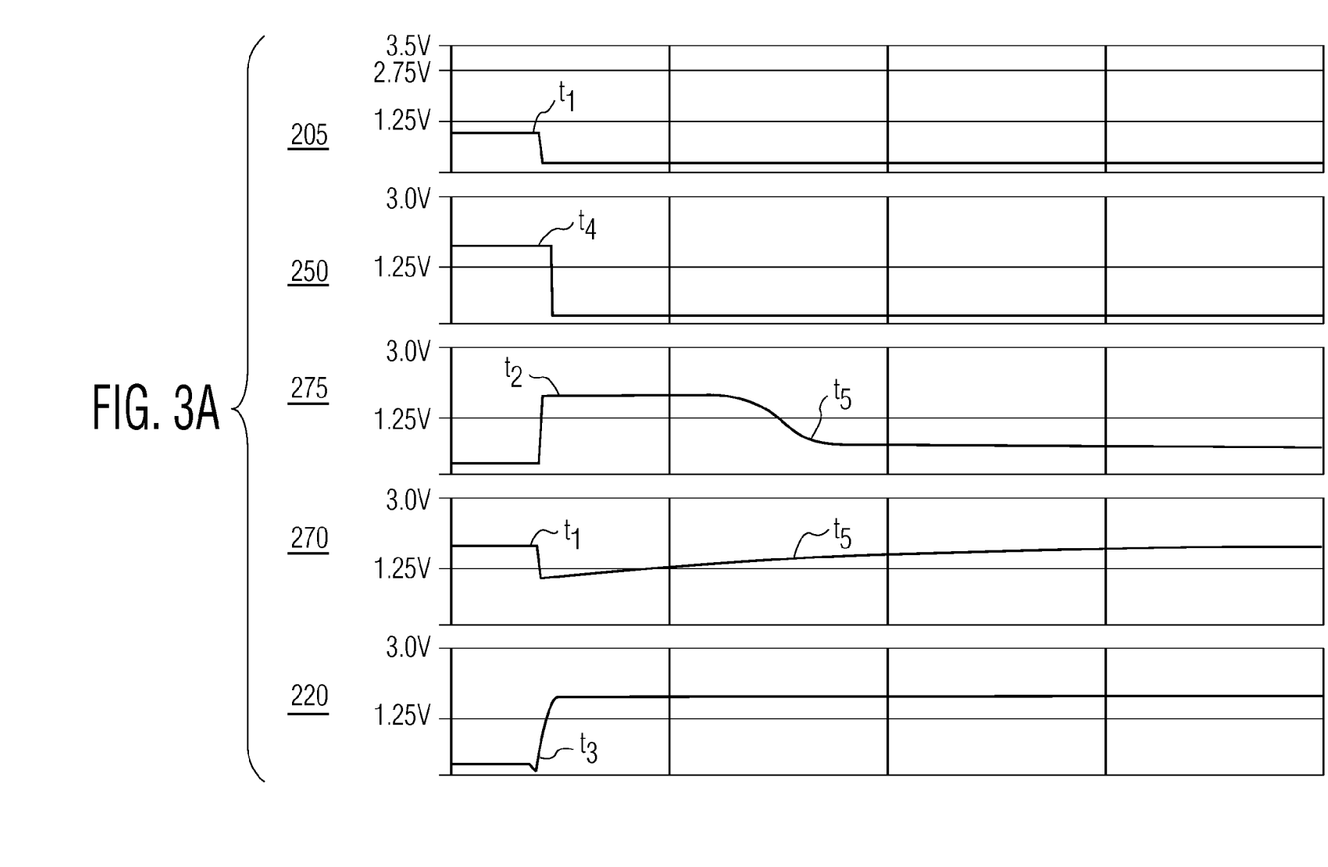

FIGS. 3A, 3B, 4A and 4B illustrate the signal levels at selected points of the receiving circuitry 114 depicted in FIG. 2 and at various times, according to example embodiments of the present invention. FIG. 3A depicts the situation when the input signal 205 transitions from high to low, where the high level of the input signal is 0.9 volts and the internal power level 225 of the receiving circuitry 114 is 1.8 volts. At time $t_1$ the input signal 205 transitions from high to low, thereby disabling FET 215. The transition of the input signal 205 is seen across the capacitor 240 causing a corresponding voltage change at the node 270 between the capacitor and the resistor 235. An inverter drives output 275 high in response to node 270 going low. This high voltage is consistent with the internal power level 225 or in this case 1.8 volts. The NOR gate 245 receives a "1" from the inverter and produces a low or "0" at the gate of FET 210. This enables FET 210 and causes the voltage on the node 220 to be driven to internal power level 225 at time $t_3$. A set of inverters produces the internal signal 250, which is an inverted version of the voltage at node 220. Accordingly, at time $t_4$ internal signal 250 changes from high to low. The NOR gate 245 receives a "1" signal from two inverters having the voltage at node 220 as an input, thereby causing FET 210 to stay on. The transition detection circuitry 230 resumes its steady-state signal level at time $t_5$, when the node 270 is pulled up by resistor 235 causing the output 275 of the inverter in the transition detection circuitry to be low.

Figure 3B:
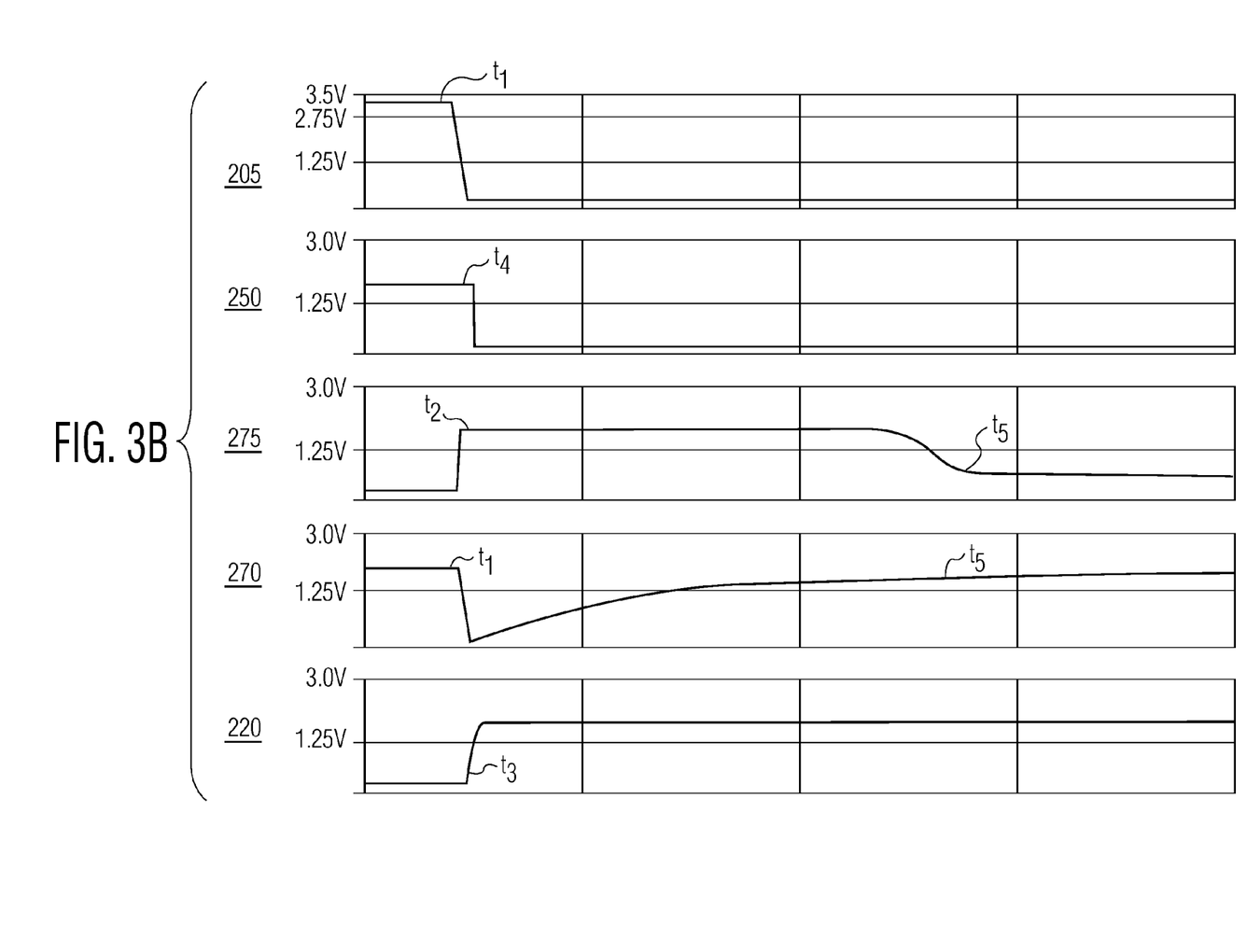

FIG. 3B depicts the same situation of the input signal 205 transitioning from high to low as in FIG. 3A, however, the high level of the input signal is 3.3 volts, with the internal power level 225 of the receiving circuitry 114 remaining at 1.8 volts. Much of the operation is identical to that discussed in connection with FIG. 3A. One difference is the voltage swing of the input signal 205 is greater. This causes a correspondingly greater voltage swing at node 270. This greater voltage swing results in a longer time period between $t_1$ and $t_5$ due to the fixed RC constant of the circuit. One skilled in the art would recognize that the RC values can be selected to meet the different signaling criteria. For instance, a stronger pull-up can be used to reduce the period between $t_1$ and $t_5$ at the expense of less sensitivity to small voltage transitions of the input signal. In a particular embodiment, a variable resistance circuit or component can be used in place of resistor 235. Thus, the device could be configured to modify the resistance for different applications, allowing for increased flexibility in signal compatibility. In similar instance, a variable capacitive circuit or component can be substituted for capacitor 240.

Figure 4A:
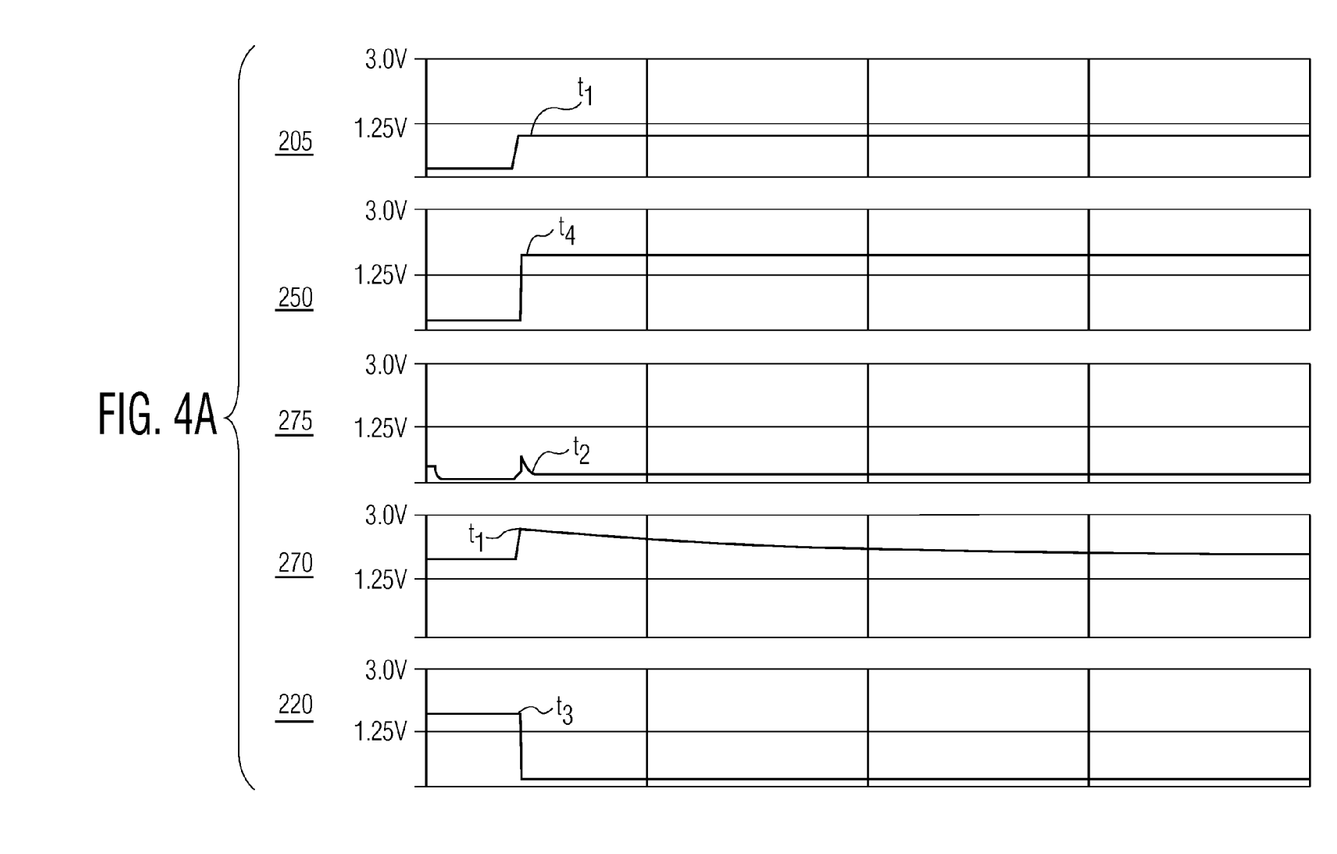

FIG. 4A depicts the situation when the input signal 205 transitions from low to high, where the high level of the input signal is 0.9 volts and the internal power level 225 of the receiving circuitry 114 is 1.8 volts. At time $t_1$ the input signal 205 transitions from low to high, thereby causing FET 215 to be enabled. The transition of the input signal 205 is seen across the capacitor 240, which causes a corresponding spike in the voltage at node 270. This voltage spike may cause a small glitch in the output 275 of the inverter. In one embodiment additional filter circuitry could be added to compensate for such glitches. For example, a filter capacitor could be added to the output 275 in order to filter out such small glitches. Regardless, the output 275 of the inverter in the transition detection circuitry 230 remains low at time $t_2$. Accordingly, when the input signal transitions from high to low the transition detection circuitry 230 does not cause a change in the internal signal 250. FET 210 drives the voltage at node 220 from high to low at time $t_3$. Two inverters produce a corresponding "0" on the input of NOR gate 245, which, in combination with output 275 being low, results in the NOR gate outputting a "1" to disable FET 215. The internal signal 250 goes from low to high at time $t_4$.

Figure 4B:
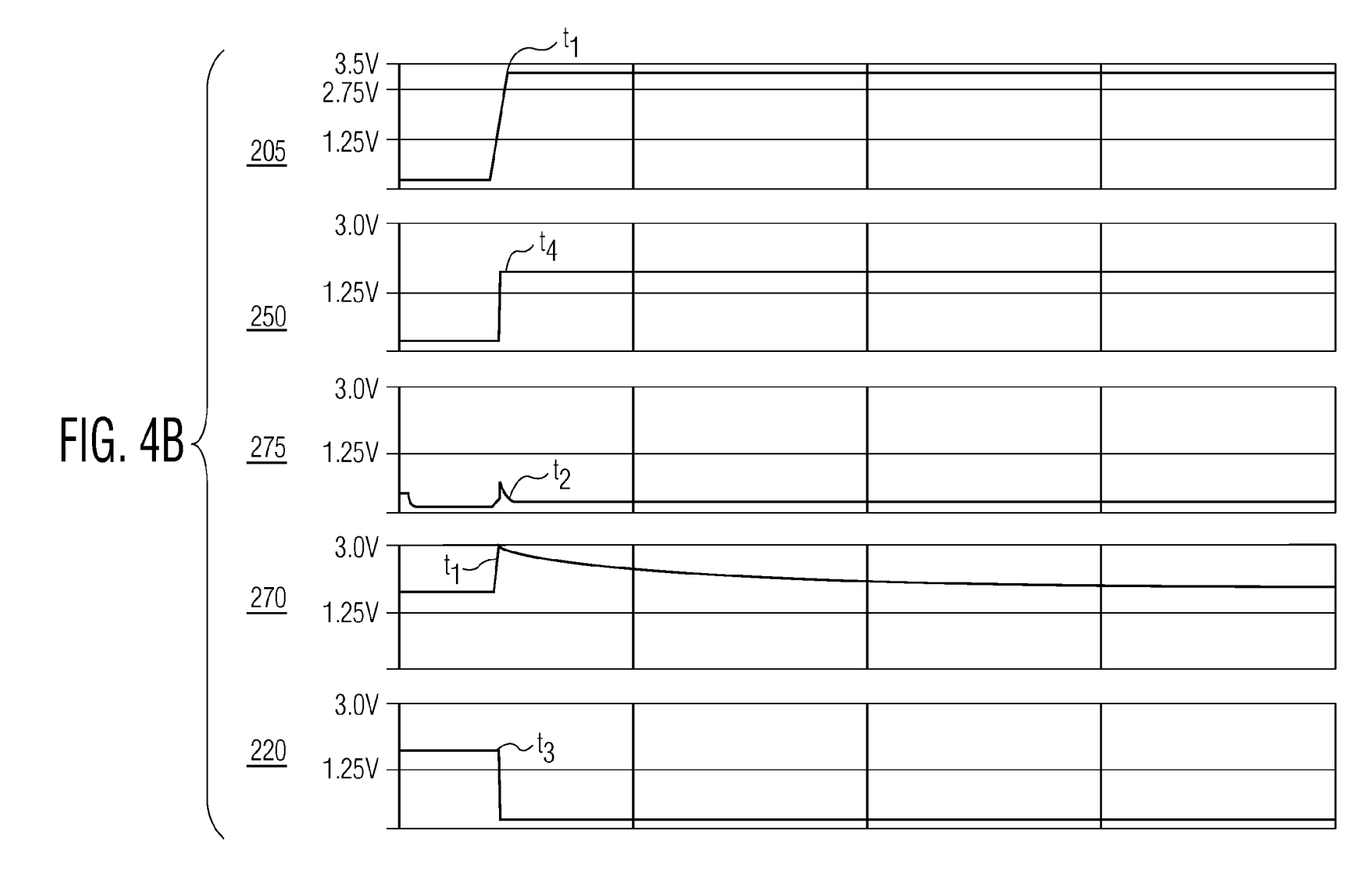

FIG. 4B depicts the same situation of the input signal 205 transitioning from low to high as in FIG. 4A, however, the high level of the input signal is 3.3 volts, with the internal power level 225 of the receiving circuitry 114 remaining at 1.8 volts.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true scope of the present invention that is set forth in the following claims

The invention claimed is:

1. An integrated circuit that produces an internal signal having a upper switching threshold (Voh) and a lower switching threshold (Vol), the internal signal responsive to an input signal with a lower switching threshold (Vil) and an upper switching threshold (Vih) different from the Voh of the internal signal, the integrated circuit comprising:
    a detection circuit that uses capacitive coupling of the input signal to isolate the detection circuit from a steady-state value of the input signal and that produces a detection signal that indicates a transition of the input signal from above Vih to below Vih;
    a first field-effect transistor (FET) that, in response to the detection signal, drives the internal signal above Voh and that, in response to the input signal exceeding Vil, releases the internal signal; and
    a second FET that drives the internal signal below Vol in response to the input signal being above Vil and that releases the internal signal in response to the input signal being below Vil.

2. The circuit of claim 1, wherein the detection circuit includes a capacitor that provides the capacitive coupling and one of a pull-up resistor and pull-down resistor on a side of the capacitor that is isolated from the input signal.

3. The circuit of claim 1, further including a NOR gate with the detection signal and the internal signal as inputs and with an output controlling the first FET.

4. The circuit of claim 1, wherein the first FET has a drain that is connected to an internal reference voltage of the integrated circuit and a source that is connected to the internal signal.

5. The circuit of claim 1, wherein the integrated circuit does not have a reference voltage that corresponds to Vih.

6. The circuit of claim 1, wherein the internal signal represents a digital signal with a 1 state and an opposite 0 state and further including an inverter for changing the internal signal to an opposite state.

7. The circuit of claim 1, wherein the first FET has a drain that is connected to an internal reference voltage of the integrated circuit and a source that is connected to the internal signal and the second FET has a drain that is connected to the internal signal and a source that is connected to another internal reference voltage.

8. The circuit of claim 7, wherein the first FET has a gate connected to a signal responsive to the detection signal and the internal signal, and wherein the second FET has a gate connected to the input signal.

9. The circuit of claim 1, further including a reset input that, independent of the input signal, places the internal signal at one of above the Voh and below the Vil.

10. A circuit arrangement for receiving an input signal indicative of a first state and a second state by providing an output signal of a first signaling range that is responsive to the input signal operating at a second signaling range, the first signaling range with a voltage for the first state that is not compatible with a voltage of the second signaling range for the first state, the circuit arrangement comprising:
    a first switch that, when enabled, drives a node to the first state in the first signaling range;
    a second switch that, when enabled, drives the node to the second state in the first signaling range;
    a transition detection circuit that detects a transition of the input signal, in the second signaling range, from the first state to the second state using capacitive coupling of the input signal to isolate the transition detection circuit from a steady-state value of the input signal; and
    control circuitry that is arranged to enable the first switch in response to the transition detection circuit detecting the transition, to disable the first switch in response to the input signal being in the first state, to enable the second switch in response to the input signal being in the first state, and to disable the second switch in response to the input signal being in the second state.

11. The arrangement of claim 10, wherein the first state represents a digital high signaling level and the second state represents a digital low signaling level.

12. The arrangement of claim 10, wherein the first switch and the second switch are field-effect transistors.

13. The arrangement of claim 10, wherein the input signal is a digital signal.

14. The arrangement of claim 10, wherein the first state represents a digital low and the second state represents a digital high.

15. The arrangement of claim 10, further including a reset signal that places the internal signal in one of the first and second states independent of the input signal.

16. A circuit arrangement for receiving an input signal indication of a first state and a second state by providing an output signal in a first signaling range that is responsive to an input signal operating in a second signaling range, the first signaling range with a voltage for the first state that is not compatible with a voltage of the second signaling range for the first state, the circuit arrangement comprising:
    a first switch means for driving the output signal to the first state in the first signaling range;
    a second switch means for driving the output signal to the second state in the first signaling range;
    a transition detection means for detecting a transition of the input signal using capacitive coupling of the input signal to isolate the detection circuit from a steady-state value of the input signal; and
    control circuitry means for controlling the first switch and the second switch in response to the state of the input signal, a signal from the detection means and a current state of the output signal.

* * * * *